United States Patent

[11] 3,629,727

[72] Inventor Jean Claude Berney
Lausanne, Switzerland
[21] Appl. No. 34,735
[22] Filed May 5, 1970
[45] Patented Dec. 21, 1971
[73] Assignees Compagnie des Montres Longines, Francillon S.A.
Berne, Switzerland;
Bernard Golay S.A.
Lausanne, Vaud, Switzerland
[32] Priority May 20, 1969
[33] Switzerland
[31] 7635/69

[54] CIRCUIT FOR SUSTAINING OSCILLATION OF A RESONATOR BY A FREQUENCY ABOVE THE NATURAL FREQUENCY OF SAID RESONATOR
3 Claims, 2 Drawing Figs.

[52] U.S. Cl. ........................................................ 331/117 R,
58/23 AO, 307/269, 331/51, 331/116 M, 331/173
[51] Int. Cl. ........................................................ H03b 3/04,
H03b 5/12
[50] Field of Search ............................................ 331/117 R,
116 M, 156, 168, 172, 173, 47, 51; 58/23 A, 23 AO; 307/269, 271

[56] References Cited

UNITED STATES PATENTS

| | | | |
|---|---|---|---|
| 3,015,785 | 1/1962 | Vass | 331/172 X |
| 3,080,533 | 3/1963 | Edwards | 331/27 X |

*Primary Examiner*—Roy Lake
*Assistant Examiner*—Siegfried H. Grimm
*Attorney*—Imirie & Smiley

ABSTRACT: An electronic circuit allowing sustaining oscillation of a resonator by a reference frequency substantially exceeding the natural frequency of the resonator, wherein pulses at reference frequency and natural frequency are applied to the inputs of an AND-gate and the resonator is coupled to the output of the AND-gate for sustaining its oscillation by the output pulses of the AND-gate.

INVENTOR.
JEAN C. BERNEY
BY
Imirie & Smiley
ATTYS.

CIRCUIT FOR SUSTAINING OSCILLATION OF A RESONATOR BY A FREQUENCY ABOVE THE NATURAL FREQUENCY OF SAID RESONATOR

This invention relates to an electronic circuit for sustaining the oscillation of a resonator having a natural frequency of $f$ by a frequency of at least approximately $n.f$. The problem of sustaining oscillation of a resonator of a relatively low frequency, for instance an audible frequency, by a stable oscillation of higher frequency may arise in electronic watches or clocks. In this case the resonator may be part of a mechanical drive for the gear-train of the watch or clock, while the higher frequency or reference frequency is produced by a stable oscillator, for instance a tuning fork oscillator or quartz oscillator.

The circuit according to this invention broadly comprises an AND gate controlled by input frequencies $f$ and respectively $n.f$, said resonator being coupled to the output of said AND gate for being maintained in oscillating state by output pulses at the frequency $f$.

An embodiment of the circuit according to this invention will now be explained by way of example with reference to the accompanying drawing wherein.

In the embodiment the resonator is an oscillating circuit LC having a resonance frequency $f$. By means of a diode D this oscillating circuit LC is coupled to the base of a transistor $T_1$ suitably biased by diode D and a resistor $R_1$. The tap between resistors $R_2$ and $R_3$ connected to the collector of transistor $T_1$, is connected to the base of a first transistor $T_2$ of an AND gate. The base of a second transistor $T_3$ of this AND gate is connected to the input III of the circuit.

Input III of the circuit is connected to a source—not shown—of rectangular pulses at a frequency of $n.f$, whereby $n$ is an entire number, in the particular case $n=2$, that is, the resonance frequency of circuit LC is half the input frequency.

Figure 1:
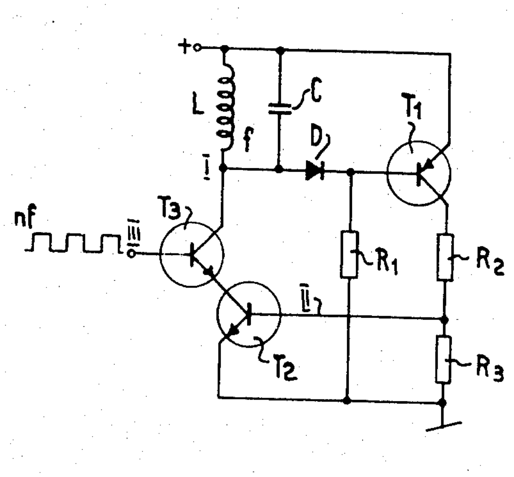
FIG. 1 is a diagram of the circuit.
Figure 2:
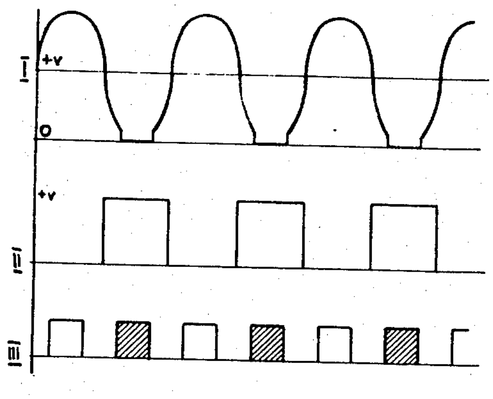
FIG. 2 illustrates the signals at points I to III of FIG. 1.

The practically sinusoidal oscillation of circuit LC is shown by diagram I in FIG. 2. This signal is applied through diode D to the base of transistor $T_1$, this transistor being conducting during the negative alternance of the oscillation of the oscillating circuit LC. Pulses of the type shown in diagram II of FIG. 2 are thus produced at point II of the circuit, that is at the base of transistor $T_2$ of the AND gate. The gate cannot open unless a pulse is applied at point II and at the base of transistor $T_2$ respectively. Therefore, the gate only transmits every second input pulse. The pulses indicated by hatching in FIG. 2 are applied at point I to the oscillating circuit LC whereby oscillation of this circuit is sustained. The effect of the sustaining pulses on the sinusoidal shape of the oscillation of circuit LC is indicated in diagram I of FIG. 2.

Of course number $n$, that is the ratio between the frequency of the input pulses and the resonance frequency of the oscillating circuit or other resonator may be higher. For a higher ratio transistor $T_1$ has to be biased in such a way that the pulses appearing at point II have a maximum duration of $1/n.f$. On the other hand, a pulse of minimum duration is needed for properly sustaining the oscillation circuit.

The ratio $n$ also depends on the Q-factor of the resonator. This factor may be improved by the use of a mechanical resonator coupled to the circuit instead of an electrical resonator. Such a mechanical resonator would be coupled on one hand to the pulse former transistor $T_1$ and on the other hand to the output of the AND-gate $T_2$, $I_3$ by means of an electromechanical transducer.

What is claimed:

1. An electric circuit for sustaining the oscillation of a resonator having a natural frequency of $f$ by a frequency of at least approximately $n.f$, whereby $n$ is an entire number, comprising an AND gate having two inputs and one output and controlled by input frequencies $f$ and $n.f$ respectively, said resonator being coupled to the output of said AND gate for being maintained in oscillating state by output pulses at the frequency $f$.

2. A circuit according to claim 1, comprising a sinusoidal resonator and a pulse former connected between said resonator and one input of said AND gate.

3. A circuit according to claim 2, wherein said pulse former is adapted to form pulses having a duration of $1/n.f$.

* * * * *